United States Patent [19]

Kitamura

[11] 4,370,643

[45] Jan. 25, 1983

[54] APPARATUS AND METHOD FOR COMPRESSIVELY APPROXIMATING AN ANALOG SIGNAL

[75] Inventor: Masatsugu Kitamura, Yokohama, Japan

[73] Assignee: Victor Company of Japan, Limited, Yokohama, Japan

[21] Appl. No.: 260,806

[22] Filed: May 5, 1981

[30] Foreign Application Priority Data

May 6, 1980 [JP] Japan .................................. 55-59638

[51] Int. Cl.$^3$ ............................................ H03K 13/00
[52] U.S. Cl. .............................. 340/347 SH; 328/151; 179/15.55 R
[58] Field of Search ................. 340/347 SH; 328/151; 179/15.55 R, 15.55 T; 358/138

[56] References Cited

U.S. PATENT DOCUMENTS 3,299,204  1/1967  Cherry .......................... 179/15.55 R Primary Examiner—C. D. Miller
Attorney, Agent, or Firm—Lowe, King, Price & Becker

[57] ABSTRACT

An input analog signal, such as a sound signal, is sampled by a sample-and-hold circuit, while sampling timing is variable in accordance with the amplitude variation of the analog signal. A difference between the amplitude of the analog signal and the amplitude of the output signal of the sample-and-hold circuit is detected, and the detected difference is integrated after passing through a square-law detector. On the other hand, the average amplitude level of the input analog signal is detected to be compared with the integrated value. The sampling timing will be determined in accordance with the result of the comparison so that frequency of sampling pulses applied to the sample-and-hold circuit varies in accordance with the waveform of the input analog signal. The interval between two adjacent sampling pulses may be detected and stored together with digitally coded signals indicative of varying amplitudes of the input analog signal for recording or writing the analog signal information in a memory.

25 Claims, 13 Drawing Figures

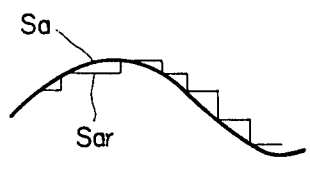
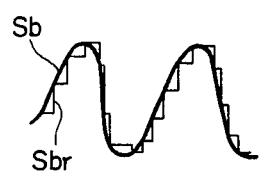
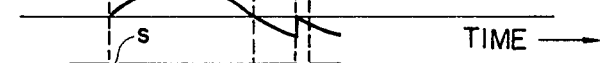
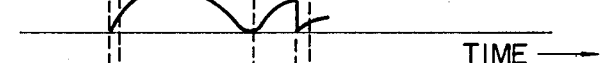
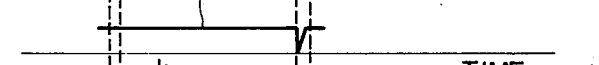
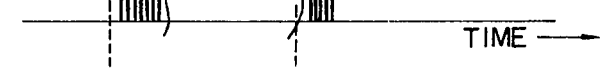
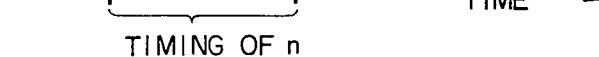

APPARATUS AND METHOD FOR COMPRESSIVELY APPROXIMATING AN ANALOG SIGNAL

BACKGROUND OF THE INVENTION

This invention relates generally to techniques for coding sound signals, which are originally analog signals, and more particularly, the present invention relates to method and apparatus for compressively approximating an input sound signal waveform to produce an output digital signal, so that transmission of and/or reproduction from the digital signal can be readily performed after the amound of data has been reduced.

Up to this time, various measures have been taken for reducing the amount of digital data or information indicative of original input sound signal waveform so that transmission and/or storage of the digital data can be effectively performed at low cost. In order to reduce or compress the amount of digital data, in the prior art, for instance, the amplitude of the original sound signal is logarithmitically compressed (log PCM), a difference between adjacent data is obtained (DPCM), or delta modulation is performed, as is well known.

In any of the above-mentioned conventional measures for reducing data amount, the interval between adjacent sampling pulses, i.e. the sampling period, is determined to be less than a reciprocal of a frequency which is twice the maximum frequency of the objective signal to be coded or sampled, so that aliasing distortion or noise is prevented from occurring. However, it is well known that occurrence of so called quantization distortion or noise is inevitable in theory when coding an analog signal into a digital signal which assumes finite number of discrete values. Because of the presence of the quantization noise distributed in the frequency range of an analog signal which has been restored from the digital signal, the quality of the restored analog signal has been deteriorated.

The common feature in conventional coding or sampling techniques is that a net or mesh extending in both directions of amplitude and time is set to pick up or sample to indicate each value close to each knot of the mesh. Therefore, even though the mesh is made fine and precise in only the direction of time, the error between the original signal waveform and the restored signal waveform does not necessarily become minimum. In other words, when care is taken in connection with only time axis in accordance with sampling theorem so as to prevent aliasing noises, quantization distortion does exist, where the degree of the quantization distortion is determined by the fineness of the mesh in the direction of amplitude.

In the above-mentioned conventional techniques, the sampling mesh is made fine in the direction of time axis so as to ensure adequate frequency range and to prevent aliasing noises. For instance, the sampling rate or frequency per one second is 8000 for vocal sounds, and 44000 for music. On the other hand, the fineness in the direction of amplitude is determined by the number of bits which represent each sampled value, and it is required to provide 7 to 8 bits for vocal sounds, and 12 to 16 bits for music.

Consequently, the amount of basic or original data or information per a second is as large as 56000 to 704000 bits. In the prior art, this enormous amount of data has been reduced in various ways as described in the above. However, the entire amount of data could only be reduced by half according to the conventional techniques. It is obvious that such a large amount of data is not economical since it takes a relatively long period of time for transmitting such a large amount of data, while a large storage device is required for storing the same. Furthermore, it takes a relatively long period of time in finding a given data from such a large amount of data.

SUMMARY OF THE INVENTION

The present invention has been developed in order to remove the above-mentioned disadvantage inherent to conventional method and apparatus for compressively approximating sound signal waveforms.

It is, therefore, an object of the present invention to provide a new and useful method and apparatus for compressively approximating analog signal waveforms so that the amount of digital data indicative of sampled values can be remarkably reduced compared to any of the conventional techniques.

According to a feature of the present invention, the interval between adjacent sampling pulses is variable: namely, the sampling period is not constant. This means that the way of sampling in the present invention is not based on sampling theorem. When the amplitude of an input analog signal, i.e. an objective sound signal to be converted into a digital signal, varies relatively gently, the interval between adjacent sampling pulses is made wide or long, and on the contrary, when the amplitude of the input analog signal varies relatively steeply or rapidly, the interval between adjacent sampling pulses is made narrow or short. To this end, the variation degree of the amplitude of the input analog signal is detected, and the detected value will be compared with an average power of the input analog signal around the instant of detection. The sampling rate or interval is thus determined in accordance with the result of the abovementioned comparison so that satisfactory S/N ratio and distortion characteristic are resulted.

According to another feature of the present invention, since the fineness of the sampling mesh in the direction of time axis is variable, bit rate or number in the direction of the amplitude of the input analog signal may be freely set throughout a wide range to a desired value which will be required to meet distortion characteristic.

In accordance with the present invention there is provided apparatus for compressively approximating an analog signal comprising: (a) first means for sampling and holding the amplitude of said analog signal in response to a sampling signal; (b) second means for producing a first signal indicative of the difference between the amplitude of said analog signal and the amplitude of an output signal from said first means; (c) third means for producing a second signal indicative of the average amplitude of said analog signal around an instant at which said analog signal has been sampled; (d) fourth means for producing a third signal when said first signal has a given relationship with respect to said second signal; and (e) fifth means for producing said sampling signal in response to said third signal.

In accordance with the present invention there is also provided a method for compressively approximating an analog signal comprising the steps of: (a) sampling and holding the amplitude of said analog signal; (b) detecting the difference between the amplitude of said analog signal and the amplitude sampled and held in advance; (c) integrating said difference; (d) detecting average amplitude of said analog signal around an instant at which said analog signal has been sampled; (e) detecting the relationship between an integrated value of said difference and said average amplitude; and (f) producing a sampling signal in accordance with said relationship, said sampling signal being used in said step (a).

BRIEF DESCRIPTION OF THE DRAWINGS

This object and features of the present invention will become more readily apparent from the following detailed description of the preferred embodiment taken in conjunction with the accompanying drawings in which:

FIG. 1 is an explanatory waveform chart showing a relatively gentle amplitude variation of an input analog signal;

FIG. 2 is an explanatory waveform chart showing a relatively steep amplitude variation of an input analog signal;

FIGS. 4 to 12 are waveform charts useful for understanding the operation of the apparatus of FIG. 3.

DETAILED DESCRIPTION OF THE PREFERRED EMBODIMENT

FIGS. 1 and 2 respectively show waveforms of two input analog signals Sa and Sb, and the relationship between an original analog sound signal Sa or Sb and an approximate waveform Sar or Sbr thereof will be described. Each of the approximate signals Sar and Sbr takes a form of stepwise waveform. As will be described in detail hereinlater, the approximate waveform signals Sar and Sbr are respectively produced by processing the original input signals Sa and Sb in such a manner that the ratio between an integrated value of a square of the difference between the amplitude or level of the original signal Sa or Sb and the amplitude of an approximate waveform signal Sar or Sbr, and an average amplitude energy of the original signal Sa or Sb in the vicinity of an instant of detection of the amplitude of the original signal Sa or Sb is maintained substantially constant. To this end, the original signal Sa, whose amplitude varies relatively gently or slowly, is sampled in the presence of sampling pulses which are spaced by a relatively long interval; and on the other hand, the original signal Sb, whose amplitude varies relatively steeply or rapidly, is sampled in the presence of sampling pulses which are spaced by a relatively short interval. In other words, in accordance with the present invention the sampling interval is variable in accordance with the rate of amplitude variation of the input analog signal. The way of changing the sampling interval will be described with reference to FIGS. 3 to 12 hereunder.

Figure 3:
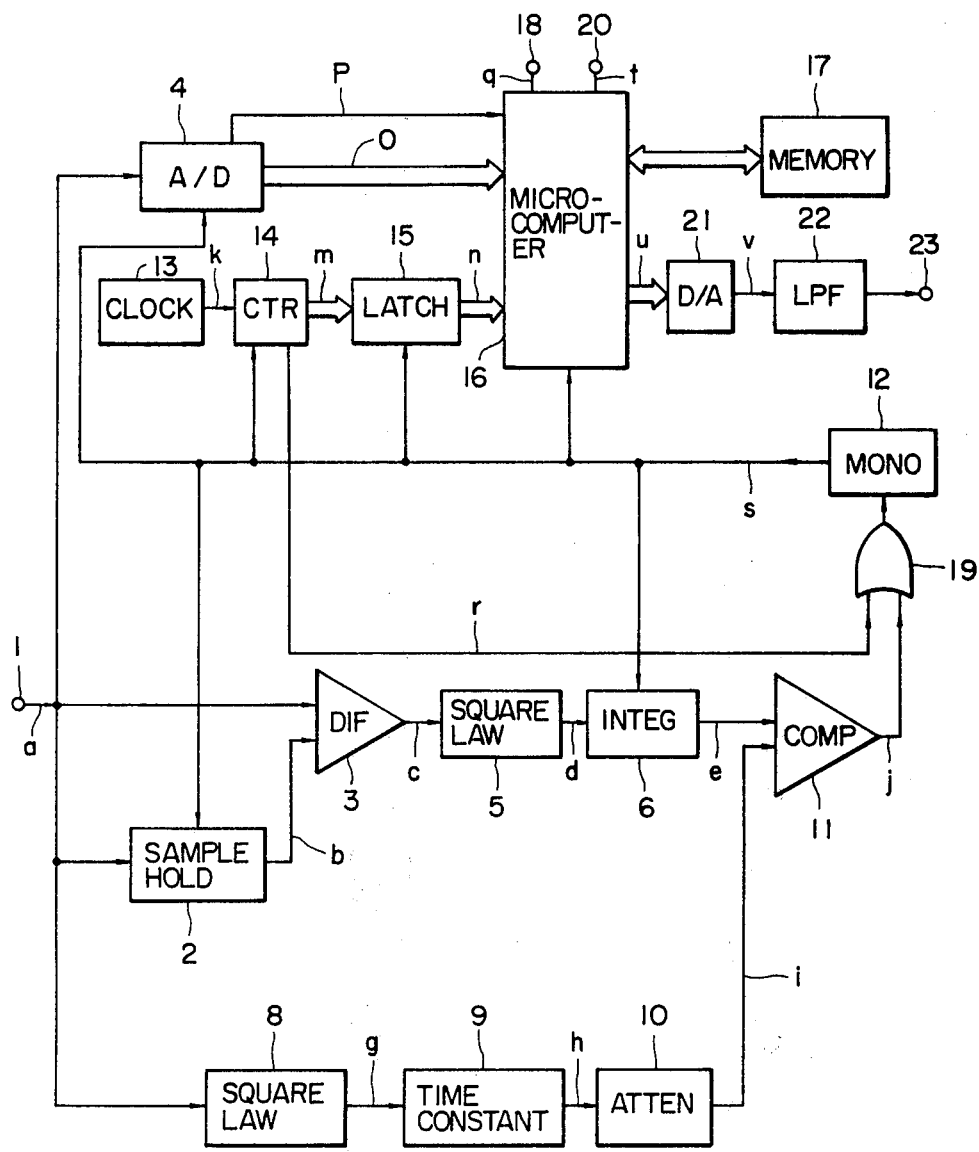
FIG. 3 is a schematic block diagram of a sound recording and reproducing apparatus to which the present invention is adapted.

FIG. 3 shows a schematic block diagram of a sound signal recording and reproducing device or system to which the present invention is adapted. Briefly describing the function of the system in FIG. 3, an input sound signal in the form of an analog signal is converted into a digital signal by sampling the amplitude of the input sound signal at a variable frequency defined by the variation rate of the amplitude of the input analog signal. The digital data will be stored in a memory, and the stored digital data will be read out when intended to reproduce or playback the recorded or written sound signal. The readout digital data will be converted into an analog signal to be emitted from a suitable loud speaker after amplified.

The system of FIG. 3 comprises an input terminal 1 for receiving an input analog signal a, i.e. the sound signal, a sample-and-hold circuit 2, a differential amplifier 3, an analog-to-digital (A/D) converter 4, a first square-law detector 5, an integrator 6, a second square-law detector 8, a time-constant circuit 9, an attenuator 10, a comparator 11, a monostable multivibrator 12, a clock pulse generator 13, a counter 14, a latch 15, a microcomputer, a memory 17, a recording key 18, an OR gate 19, a reproducing key 20, a digital-to-analog (D/A) converter 21, a low pass filter (LPF), and an output terminal 23.

Waveforms of signals at various portions of the system of FIG. 3 are shown in FIGS. 4 to 12, where the same references a to e, j, k, n and s are used for indicating the same signals in FIG. 3.

The input terminal 1 is connected to an input terminal of the sample-and-hold circuit 2, an input terminal of the second square-law detector 8 and to an input terminal of the A/D converter 4. The output terminal of the sample-and-hold circuit 2 is connected to an input terminal of the differential amplifier having another input terminal connected to the above-mentioned input terminal 1. The output terminal of the differential amplifier 3 is connected via the first square-law detector 5 and the integrator 6 to a first input terminal of the comparator 11 having a second input terminal connected to an output terminal of the attenuator 10. The attenuator 10 is responsive to an output signal of the second square-law detector 8 applied via the time-constant circuit 9, which functions as a smoothing circuit. The output terminal of the comparator 11 is connected to an input terminal of the OR gate 19 having another input terminal connected to a carry output terminal of the counter 14. Here, the inputs of the OR gate 19 are of negative logic. The output terminal of the OR gate 19 is connected to an input terminal of the monostable multivibrator 12 whose output terminal is connected to the sample-and-hold circuit 2 for applying a sampling pulse s. The sampling pulse signal s is also applied to the integrator 6, the A/D converter 4, the counter 14, the latch 15 and to the microcomputer 16 as a timing signal or a control signal.

An output terminal of the clock pulse generator 13 is connected to an input terminal of the counter 14 which counts the number of clock pulses k applied thereto to emit an output digital data m indicative of the counted number. The counter output terminal, which actually comprises a plurality of terminals for forwarding a digital data in parallel, is connected to an input terminal of the latch 15. In FIG. 3, digital data transmission is implied by wide arrowed lines. The output terminal of the latch 15 is connected to the microcomputer 16. The A/D converter 4 has an output terminal and another terminal both connected to the microcomputer 16. The above-mentioned another terminal of the A/D converter 4 is used for deriving a signal p indicative of termination or completion of analog-to-digital conversion. A memory 17, such as a random access memory (RAM), is connected to the microcomputer 16 so as to write and read data. The D/A converter 21 is connected to the microcomputer 16 for receiving a digital data u indicative of a sound signal waveform read out from the memory 17. The output terminal of the D/A converter 21 is connected via the low pass filter 22 to the output terminal 23. The output terminal 23 may be connected to a suitable audio amplifier (not shown) to drive a loud speaker (not shown).

The system of FIG. 3 operates as follows:

The sample-and-hold circuit 2 samples the amplitude value of the original signal a at an instant of the presence of the sampling pulse s (the way of producing the sampling pulse s will be described hereinlater), and holds the sampled value until a subsequent sampling pulse s is applied to emit a signal b corresponding to the sampled value of the original signal a which is also applied to the above-mentioned differential amplifier 3 as its other input.

The differential amplifier 3 emits a difference signal c to supply the first square-law detector 5 with the same, and a signal d having a relationship of (signal c)$^2$=d is emitted from the first square-law detector 5, and is integrated by the integrator 6 so that a signal e shown in FIG. 9 will be emitted from the integrator 6 to be applied to the comparator 11 as a comparison signal.

On the other hand, the original signal a from the input terminal 1 is detected by the second square-law detector 8 to become a signal g, and the above-mentioned signal g is smoothed by the time-constant circuit 9 to become a signal h applied to the attenuator 10 (level adjuster). An output signal i from the attenuator 10 is applied to the above-mentioned comparator 11 as its reference signal i. Then, an output j indicative of the result of comparison between the signal e and the reference signal i is applied from the comparator 11 via the OR gate 19 to the monostable multivibrator 12 as a trigger signal.

The monostable multivibrator 12 produces a pulse s of a given width each time the trigger signal is applied thereto, and this pulse s is applied to the above-mentioned sample-and-hold circuit 2 as the sampling pulse s, and is further applied to the A/D converter 4, the integrator 6, the counter 14, the latch 15, and to the microcomputer 16 as described in the above.

As it is arranged such that the sampling pulse s is generated each time the signal e indicative of the integrated value of the square of the difference between the sampled value b of the original signal and the amplitude value of the above-mentioned original signal a at an instant after the instant, at which the above-mentioned sampled value has been obtained, becomes greater in ratio than the signal i indicative of the average amplitude energy (power level) of the original signal a around the instant at which the above-mentioned sampled value has been obtained, the output signal b from the sample-and-hold circuit 2 becomes an approximated stepwise waveform signal b having a given error (this corresponds to a given S/N and distortion) with respect to the original signal a. Furthermore, as described in the above, since the A/D converter 4 is supplied with the above-mentioned sampling pulse s, the digital signal o emitted from the A/D converter 4 corresponds to the approximated stepwise waveform signal b emitted from the sample-and-hold circuit 2.

In other words, the length of the holding time of the sample-and-hold circuit 2 required until the integrated value of the square of the error or deviation of the original input signal a from the approximated stepwise waveform signal b becomes greater in ratio than the power level of the original signal a around an instant of the detection or approximation, can be determined by the interval between two adjacent output pulses s from the monostable multivibrator 12.

Although it has been described that the system or circuitry of FIG. 3 is for recording and reproducing a sound signal by converting the analog sound signal into a digital signal to store the digital data in the memory 17 and reading out the stored data, the system of FIG. 3 may be simply used as a sample-and-hold circuit arrangement. When it is intended to use the system of FIG. 3 as such a sample-and-hold circuit arrangement, various circuits, such as the A/D converter 4, the microcomputer 16 the clock pulse generator 13 and other related circuits are unnecessary. Namely, the output signal b of the sample-and-hold circuit 2, which is controlled by the sampling pulse signal s from the monostable multivibrator 12, will be derived as the output signal of the sample-and-hold circuit arrangement.

Now the way of recording or writing the sound signal and the way of reproducing or reading the stored data will be described hereinbelow. According to the present invention, the above-mentioned interval between adjacent sampling pulses s is stored in the memory 17 in such a manner that this interval or time data is teamed up with a corresponding amplitude digital data.

The clock pulse generator 13, the counter 14 and the latch 15 are employed for detecting the above-mentioned interval between adjacent sampling pulses s in the form of digital data. In detail, the counter 14 is arranged to start counting the number of the clock pulses k from the clock pulse generator 13 in response to a leading edge of the sampling pulse s applied thereto from the monostable multivibrator 12. Thus the counter 14 produces an output signal m indicative of the number of the clock pulses k applied thereto between two adjacent sampling pulses s, where the output signal m is a digital signal. This output digital data m is applied to the latch 15 to be held therein, and is transmitted to the microcomputer 16 each time the sampling pulse s is applied thereto. The output data, which is indicated at a reference n, of the latch 15 is fetched into the microcomputer 16 in response to the trailing edge of the sampling pulse s, and is stored in the memory 17 as will be described hereinlater. As implied by the wide arrowed line between the latch 15 and the microcomputer 16, the digital data n indicative of an interval between two adjacent sampling pulses s is transmitted in parallel. FIG. 12, therefore, shows only the timing of the transmission of the data n.

On the other hand, the original input analog sound signal a applied from the input terminal 1 to the A/D converter 4 is converted, with the timing of the sampling pulses s, into a digital signal or data o. The A/D converter 4 may comprise a sample-and-hold circuit (not shown) which is substantially the same as the sample-and-hold circuit 2. The output data o indicative of the amplitude of the original input sound signal a from the A/D converter 4 is applied to the microcomputer 16. In detail, when the aforementioned signal p indicative of the termination or completion of analog-to-digital conversion is applied to the microcomputer 16, the microcomputer 16 fetches the data o to store the same in the memory 17.

The amplitude data o and the interval or time data n are both fetched so that these data o and n are stored in the memory 17 as a set of data or information. Namely, the interval data n is correlated or teamed up with the amplitude data o so that each set of the data will be read out from the memory 17 when intended. The above-described fetching and storing operation of the amplitude data o and the interval data n is repeated as long as subsequent sampling pulses s are applied, so that respective sets of data or information will be stored in the memory 17 in a given sequence.

The recording key 18 and the reproducing key 20 may be manually operable. When it is intended to record or write the sound signal information in the memory 17, the recording key 18 may be manipulated, and on the other hand, when it is intended to reproduce or read out stored data from the memory 17, the reproducing key 20 may be manipulated. These keys 18 and 20 are respectively arranged to supply the microcomputer 16 with given command signals q and t.

Figure 13:
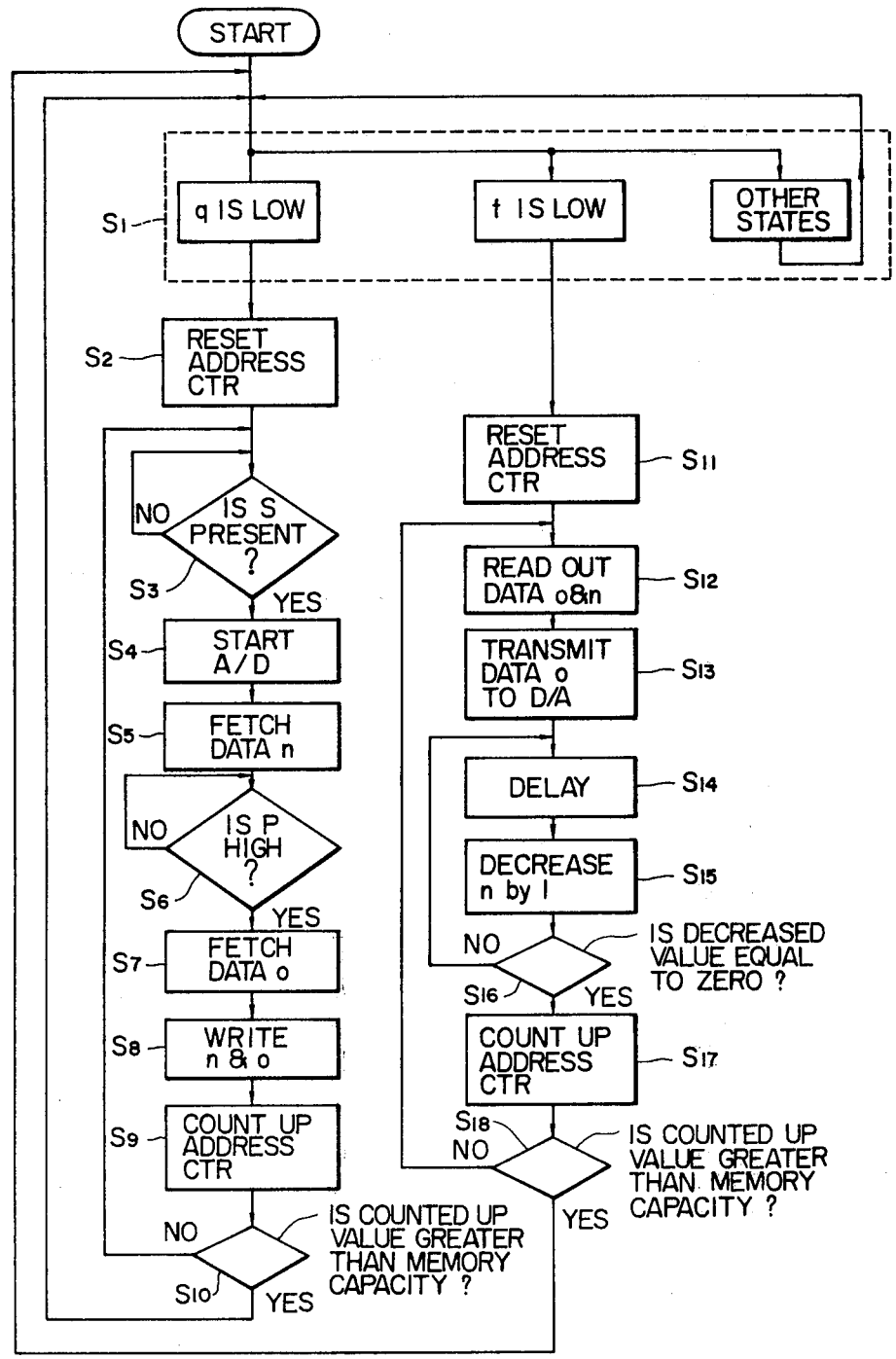
FIG. 13 is a schematic flow chart showing the operational sequence of the microcomputer included in the apparatus of FIG. 3.

The operation of the microcomputer 16 will be described briefly with reference to a flowchart of FIG. 13, showing the operational sequence.

It is assumed that the recording key 18 has been manipulated so that the level of the first command signal q becomes low or negative. The level of the first command signal q is detected in a first step S1, and in this case, the operational flow enters into a second step S2 in which an address counter (not shown) in the microcomputer 16 is reset to determine the address of the memory 17. Namely, preparation for storing the above-mentioned data o and n in the memory 17 is performed in this second step S2. In a following step S3, it is checked whether the traling edge of the sampling pulse s is being detected, and when detected, the answer of the step S3 becomes YES to enter a following step S4. In the step S4, analog-to-digital conversion by the A/D converter 4 is started in response to the trailing edge of the sampling pulse s. Then in a following step S5, the microcomputer 16 fetches the value of the data n from the latch 15. In a step S6, it is checked whether the conversion termination signal p from the A/D converter 14 has returned to a high level state, and when returned, the answer of the step S6 becomes YES to go to a step S7. In the step S7, the microcomputer 16 fetches the data o of the A/D converter 14.

Nextly, in a step S8, the value of the above-mentioned data n and the value of the data o are wrote in the memory 17, and in a step S9, the address counter is counted up to prepare for next writing. In a step S10, it is detected whether the value counted up in the step S9 has exceeded the capacity of the memory 17, and if exceeded, writing operation into the memory 17 is terminated to return to the step S1, and on the other hand, if not exceeded, the operational flow returns to the step S3.

When the counted value of the counter 14 of FIG. 3 indicates a maximum value, the carry output r of the counter 14 is applied via the OR gate 19 to the monostable multivibrator 12 as the trigger signal to trigger the monostable multivibrator 12 causing the same to produce the sampling pulse s. With this operation, when the counter 14 indicates the maximum counted value, the sampled value of the data o at this instant and a corresponding interval value of the data n are stored in the memory 17 even if the integrated value of the square of the difference between the original input sound signal a and the sampled value indicated by the output signal b of the sample-and-hold circuit 2 is less than the average power indicated by the signal i from the attenuator 10. In other words, the monostable multivibrator 12 produces the sampling pulses s when one of the carry signal r from the counter 14 and the output signal j of the comparator 11 is applied via the OR gate 19 thereto. As described in the above, the input analog sound signal a is coded in the form of a digital signal, and digital data indicative of both the amplitudes and sampling intervals are stored in the memory 17 to complete the recording or writing operation.

Let us assume now the reproducing key 20 has been manipulated for reproducing or reading out the stored data. The aforementioned second command signal t from the reproducing key 20 becomes negative or low, and this state is detected in the above-mentioned first step S1 of the flow chart of FIG. 13. In the reproducing mode, which will take place after the manipulation of the reproducing key 20, the sets of information or data, each of which includes a sampled value and a corresponding interval value, are read out from the memory 17 in a given sequence. An amplitude data in the read out data is fed to the D/A converter 21 to be converted into an analog signal v which will be applied to the low pass filter 22 in turn. High frequency components included in the output signal v of the D/A converter 21 are eliminated by the low pass filter 22 to be applied to the output terminal 23.

Turning back to FIG. 13, after the detection of the low or negative state of the second command signal t, the operational flow enters into a step S11 in which the aforementioned address counter provided for determining the address of the memory 17 is reset. In a following step S12, the data stored in the memory 17 is read out. Namely, a set of data including both an amplitude data and an interval data is read out. In a step S13, only the amplitude data corresponding to the original data o from the A/D converter 4 is transmitted to the D/A converter 21. This amplitude data fed to the D/A converter 21 is designated at a reference u. The remaining data, namely, the interval data corresponding to the data n originally applied from the latch 15, will be used in the microcomputer 16 for determining an interval or waiting time until a next amplitude data u is applied to the D/A converter 21. Thus the level or amplitude of the analog output signal v of the D/A converter 21 is maintained constant in the same manner as the signal b of FIG. 5 for an interval which is defined by the other data n read out from the memory 17.

A step S14 following the step S13 is for delaying program execution, and the amount of delay is arranged to be substantially equal to or slightly less than the period of the clock pulses k from the clock pulse generator 13. As will be described hereinafter, steps S14 to S16 will be repeated a plurality of times so that next amplitude data u will be fed to the D/A converter 21 after an interval equal to the interval obtained in the aforementioned recording mode. This point will be further described. In the step S15, the digital value of the data n is decreased by 1, and the result of the subtraction is checked to see whether the subtracted value equals zero or not in a step S16. If the answer of the step S16 is NO, namely, when the decreased value of the data n is greater than zero, the operational flow returns to the step S14. On the contrary, if the answer of the step S16 is YES, the flow enters into a step S17. The step S17 and a following step S18 are respectively correspond to the aforementioned steps S9 and S10. Namely, the same operations as those of the steps S9 and S10 are respectively executed, and therefore, description thereof is omitted. From the above, it will be understood that the value of the interval data n read out from the memory 17 is used, in the reproducing mode, to control the transmitting interval or timing of the subsequent amplitude data o also read out from the memory 17. With this operation, the level or amplitude of the output analog signal v of the D/A converter 21 is held constant as long as steps S14 to S16 are repeated. As a result, stepwise analog signal, whose waveform is represented by the signal Sar or Sbr of FIG. 1 or 2, is obtained at the output terminal of the D/A converter 21.

The recording and reproducing period of time is basically determined by the capacity of the memory 17. Assuming that each of the amplitude data o is of 7-bit, each of the interval data n is of 5-bit, the frequency of the clock pulses k is 20 KHz, the average frequency of the sampling pulse s may become approximately 700 Hz. Under this condition, a sound signal can be recorded and then reproduced for approximately 30 seconds in the case that a RAM of 32 K byte is used as the memory 17.

Although in the above-described embodiment, the first and second square-law detectors 5 and 8 are employed, the first and second square-law detectors 5 and 8 may be replaced with linear detectors (not shown) in the case high accuracy in approximation is not required.

From the foregoing description, it will be understood that the number of amplitude data can be drastically reduced compared to any of conventional sampling or coding techniques. Since compression of data amount can be achieved according to the present invention, the digital data can be readily transmitted and/or stored. Moreover, when intended to find a particular data from the entire data, the objective data can be read out within a relatively short period of time. It will be apparent for those skilled in the art that many modifidations and variations may be made without departing from the spirit of the present invention.

What is claimed is:

1. Apparatus for compressively approximating an analog signal comprising:
   (a) first means for sampling and holding the amplitude of said analog signal in response to a sampling signal;
   (b) second means for producing a first signal indicative of the difference between the amplitude of said analog signal and the amplitude of an output signal from said first means;
   (c) third means for producing a second signal indicative of the average amplitude of said analog signal around an instant at which said analog signal has been sampled;
   (d) fourth means for producing a third signal when said first signal has a given relationship with respect to said second signal; and
   (e) fifth means for producing said sampling signal in response to said third signal.

2. Apparatus for compressively approximating an analog signal as claimed in claim 1, wherein said first means comprises a sample-and-hold circuit.

3. Apparatus for compressively approximating an analog signal as claimed in claim 1, wherein said second means comprises a differential amplifier.

4. Apparatus for compressively approximating an analog signal as claimed in claim 3, further comprising an integrator responsive to an output signal of said differential amplifier.

5. Apparatus for compressively approximating an analog signal as claimed in claim 3, further comprising a square-law detector responsive to an output signal of said differential amplifier, and an integrator responsive to an output signal of said square-law detector.

6. Apparatus for compressively approximating an analog signal as claimed in claim 1, wherein said third means comprises a smoothing circuit.

7. Apparatus for compressively approximating an analog signal as claimed in claim 6, further comprising an attenuator responsive to an output signal of said smoothing circuit.

8. Apparatus for compressively approximating an analog signal as claimed in claim 6 or 7, further comprising a square-law detector responsive to said analog signal for supplying said smoothing circuit with an output signal of said square-law detector.

9. Apparatus for compressively approximating an analog signal as claimed in claim 1, wherein said fourth means comprises a comparator responsive to both said first and second signals.

10. Apparatus for compressively approximating an analog signal as claimed in claim 1, wherein said fifth means comprises a monotable multivibrator.

11. Apparatus for compressively approximating an analog signal as claimed in claim 1, further comprising:
    (a) sixth means for converting said analog signal into a first digital signal with a timing of said sampling signal;
    (b) seventh means for detecting each interval between two adjacent sampling pulses of said sampling signal and for producing a second digital signal for each detected interval; and
    (c) eighth means for storing said first and second digital signals.

12. Apparatus for compressively approximating an analog signal as claimed in claim 11, further comprising ninth means for controlling writing and reading operations of said eighth means.

13. Apparatus for compressively approximating an analog signal as claimed in claim 12, further comprising tenth means for converting said first digital signal read out into an analog signal.

14. Apparatus for compressively approximating an analog signal as claimed in claim 13, further comprising a low pass filter responsive to said analog signal from said tenth means.

15. Apparatus for compressively approximating an analog signal as claimed in claim 11, wherein said seventh means comprises:
    (a) a clock pulse generator; and
    (b) a counter for counting the number of clock pulses from said clock pulse generator, said counter being controlled by said sampling signal.

16. Apparatus for compressively approximating an analog signal as claimed in claim 15, further comprising a latch responsive to a data from said counter, said latch being controlled by said sampling signal.

17. Apparatus for compressively approximating an analog signal as claimed in claim 12, wherein said ninth means comprises a microcomputer the operation of which is controlled by said sampling signal.

18. Apparatus for compressively approximating an analog signal as claimed in claim 17, wherein said sixth means comprises an analog-to-digital converter controlled by said sampling signal, said analog-to-digital converter producing a signal indicative of completion of analog-to-digital conversion, said microcomputer being further controlled by said signal indicative of conversion completion.

19. Apparatus for compressively approximating an analog signal as claimed in claim 17, further comprising first and second keys for producing first and second command signals respectively applied to said microcomputer for starting writing operation and reading operation.

20. A method for compressively approximating an analog signal comprising the steps of:
    (a) sampling and holding the amplitude of said analog signal;
    (b) detecting the difference between the amplitude of said analog signal and the amplitude sampled and held in advance;
    (c) integrating said difference;
    (d) detecting average amplitude of said analog signal around an instant at which said analog signal has been sampled;
    (e) detecting the relationship between an integrated value of said difference and said average amplitude; and
    (f) producing a sampling signal in accordance with said relationship, said sampling signal being used in said step (a).

21. A method for compressively approximating an analog signal as claimed in claim 20, wherein said step of detecting the difference further comprises a step of detecting square value of said difference.

22. A method for compressively approximating an analog signal as claimed in claim 21, wherein said step of detecting average amplitude comprises the steps of:
    (a) detecting a square value of said analog signal; and
    (b) smoothing said square value.

23. A method for compressively approximating an analog signal as claimed in claim 22, wherein said step of detecting average amplitude further comprises a step fo attenuating a smoothed value.

24. A method for compressively approximating an analog signal as claimed in claim 23, wherein said step fo detecting said relationship comprises a step of comparing said integrated value with an attenuated value of said smoothed value.

25. A method for compressively approximating an analog signal as claimed in claim 20, further comprising the steps of:
    (a) converting said analog signal into a first digital signal with a timing of said sampling signal;
    (b) detecting each interval between two adjacent sampling pulses of said sampling signal, and producing a second digital signal for each detected invertal; and
    (c) storing said first and second digital signals as a correlated data.

* * * * *